(12) United States Patent
Hampton

(10) Patent No.: US 6,861,336 B1
(45) Date of Patent: Mar. 1, 2005

(54) DIE THINNING METHODS

(75) Inventor: Kevin Wade Hampton, Eau Claire, WI (US)

(73) Assignee: Union Semiconductor Technology Corporation, Plymouth, MN (US)

(*) Notice: Subject to any disclaimer, the term of this patent is extended or adjusted under 35 U.S.C. 154(b) by 0 days.

(21) Appl. No.: 10/724,982

(22) Filed: Nov. 30, 2003

(51) Int. Cl.[7] .................... H01L 21/46; H01L 21/78; H01L 21/301

(52) U.S. Cl. .................... 438/460; 438/113; 438/68; 438/33

(58) Field of Search .................... 438/460, 33, 68, 438/113, 114, 115, 118, 455, 458, 459

(56) References Cited

U.S. PATENT DOCUMENTS 6,013,534 A * 1/2000 Mountain .................... 438/15
6,582,983 B1 * 6/2003 Runyon et al. .............. 438/33

* cited by examiner

Primary Examiner—David Nhu
(74) Attorney, Agent, or Firm—Jones Day

(57) ABSTRACT

A die thinning method includes providing a wafer (10) and depositing a substrate bonding material on the wafer. The die thinning method places a plurality of die (12) on the wafer (10), cures the substrate bonding material to secure the individual ICs to the base wafer (10), and covers the substrate (10) and the die (12) with a mask material. The substrate bonding material is BCB. The mask material is a photoresist (14). The method further back grinds the wafer to remove the wafer and to reduce the original die thickness from 26 mils to 5 mils. A UV transfer tape (22) is applied to the die (12) on a film frame (20). The mask material and back grinding tape (18) are then removed. The plurality of die (12), UV transfer tape (22), and film frame (20) are placed face down in a UV cure station. The UV transfer tape (22) is UV irradiated and the plurality of die (12) are removed from the UV transfer tape (22).

19 Claims, 2 Drawing Sheets

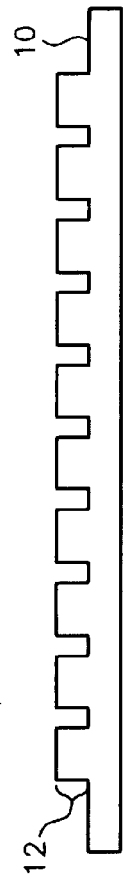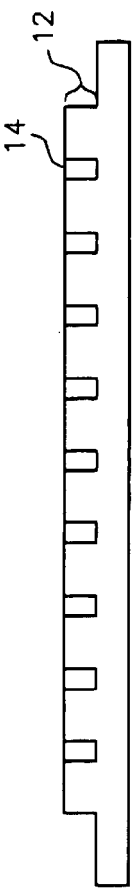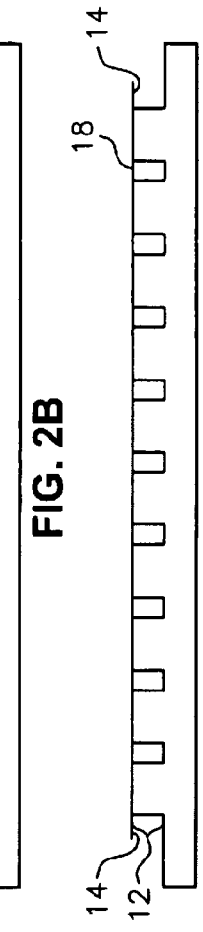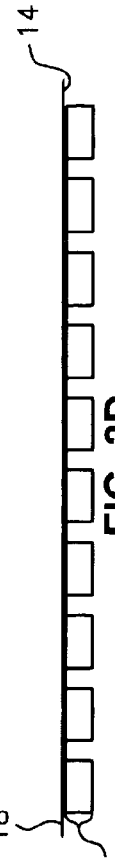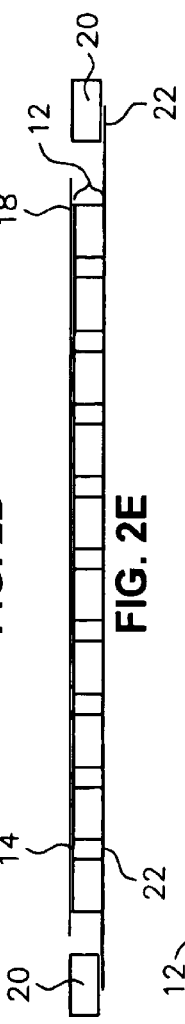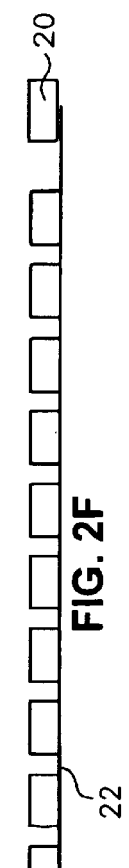

DIE THINNING METHODS

The present invention generally relates to apparatus and methods for thinning dies, and more particularly to apparatus and methods for thinning dies to make magnetic random access memory.

BACKGROUND OF THE INVENTION

As electronic systems grow in complexity, the need for compact packaging of electronic components increases. Furthermore, with increasing complexity, other factors, such as power, size, and weight, require consideration. Thin die, or chips, allow for more compact packaging of electronic components. Thin die are particularly useful in multiple chip packages, providing for packaging of a greater number of die within the same volume. These multiple chip packages often employ three-dimensional packaging technologies, by stacking chips, or die, along the z-axis.

Techniques that reduce structural strain on the die during processing would allow the use of thin die.

Fabricating thin die in multiple chip modules would provide further advantages for compact packaging of electronic components. By fabricating thin die in multiple chip modules, handling and assembly of individual components can be reduced, lessening the possibility of breakage or other assembly defects. Current processing techniques do not provide for fabrication of discrete multiple chip modules having thinned die. Therefore, there is a need for processing methods that allow for thinning wafers to obtain thin die.

Thus, there is a need for methods and apparatus for manufacturing thin die.

SUMMARY OF THE INVENTION

The present invention solves these needs and other problems in the field of manufacturing thin die by providing, in the preferred form, methods that provide a substrate. A substrate bonding material is then deposited on the substrate and a plurality of die are placed on the substrate. The methods according to the preferred teachings of the present invention then cure the substrate bonding material to secure the plurality of die to the substrate. The substrate and the plurality of die are covered with a mask material. A back grinding tape is applied to a surface of the mask material. The substrate and the plurality of die are ground to thin the plurality of die. A UV transfer tape is applied to the die on a film frame. The mask material and back grinding tape are then removed. The plurality of die, UV transfer tape, and film frame are placed face down in a UV cure station. The UV transfer tape is then UV illuminated, and the plurality of die are removed from the UV transfer tape.

It is therefore a further object of the invention to provide novel methods where the substrate bonding material is BCB.

It is therefore a further object of the invention to provide novel methods where curing the substrate bonding material to secure the plurality of die to the substrate comprises curing in an oven for six minutes at at least 250° degrees Centigrade.

It is therefore a further object of the invention to provide novel methods where covering the substrate and the die with the mask material further comprises covering the substrate and the die with a photoresist.

It is therefore a further object of the invention to provide novel methods where covering the substrate and the die with a mask material further comprises spin casting the mask material to a thickness of 15 microns and soft baking on a hot plate at a temperature of at least 100° C. for at least 1 minute.

It is therefore a further object of the invention to provide novel methods where covering the substrate and the die with the mask material further comprises covering the substrate and the die with metal.

It is therefore a further object of the invention to provide novel methods where covering the substrate and the die with the mask material further comprises covering the substrate and the die with oxide.

It is therefore a further object of the invention to provide novel methods where covering the substrate and the die uses standard photoresist coating methods.

It is therefore a further object of the invention to provide novel methods where grinding the substrate and the plurality of die further comprises grinding the substrate and the plurality of die to remove the substrate and to reduce an original die thickness from 26 mils to 5 mils.

It is therefore a further object of the invention to provide novel methods where removing the mask material and the back grinding tape further comprises placing the die and the back grinding tape so that they are positioned face up in a ultraviolet cure station.

It is therefore a further object of the invention to provide novel methods where the back grinding tape is UV irradiated and cured for at least 2 minutes to reduce an adhesive strength to less than or equal to 5 g/25 mm.

It is therefore a further object of the invention to provide novel methods that, after the back grinding tape has been cured and while it maintains a force of 5 g/25 mm applied to a top surface of the die, the back grinding tape and die are placed face down on a manual tape station and a transfer tape is then applied to a backside of the die along with a dicing film frame as a mechanical stabilizer to secure the plurality of die that have been thinned.

It is therefore a further object of the invention to provide novel methods that remove the back grinding tape with tweezers once the film frame, transfer tape and thinned ICs are secure.

It is therefore a further object of the invention to provide novel methods that remove the mask material by exposing, developing and rinsing and removing the mask material, debris, and tape residue from the plurality of die.

It is therefore a further object of the invention to provide novel methods that place those die still secure to the UV transfer tape and film frame face down in a UV cure station.

It is therefore a further object of the invention to provide novel methods that UV irradiate the UV transfer tape for 2 minutes to reduce an adhesive strength from 400 g/25 mm to 5 g/25 mm.

It is therefore a further object of the invention to provide novel methods that place the film frame, transfer tape, and plurality of die on a die ejection system followed by a pick and place operation into waffle pack shipping containers.

It is therefore a further object of the invention to provide novel methods that provide a substrate made from a wafer.

It is therefore a further object of the invention to provide novel methods that provide a substrate made from a silicon wafer.

These and further objects and advantages of the present invention will become clearer in light of the following detailed description of an illustrative embodiment of this invention described in connection with the drawings.

BRIEF DESCRIPTION OF THE DRAWINGS

The illustrative embodiment may best be described by reference to the accompanying drawings where:

FIG. 2A shows a plurality of known good die on a substrate.

FIG. 2B shows the deposition of a photoresist mask on the known good die.

FIG. 2C shows the addition of back grinding tape on the photoresist mask.

FIG. 2D shows the grinding of the substrate and the die.

FIG. 2E shows the application of an Ultraviolet UV transfer tape to the backside of the die is on a dicing film frame.

FIG. 2F shows the removal of the back grinding tape and photoresist mask.

Figure 1:
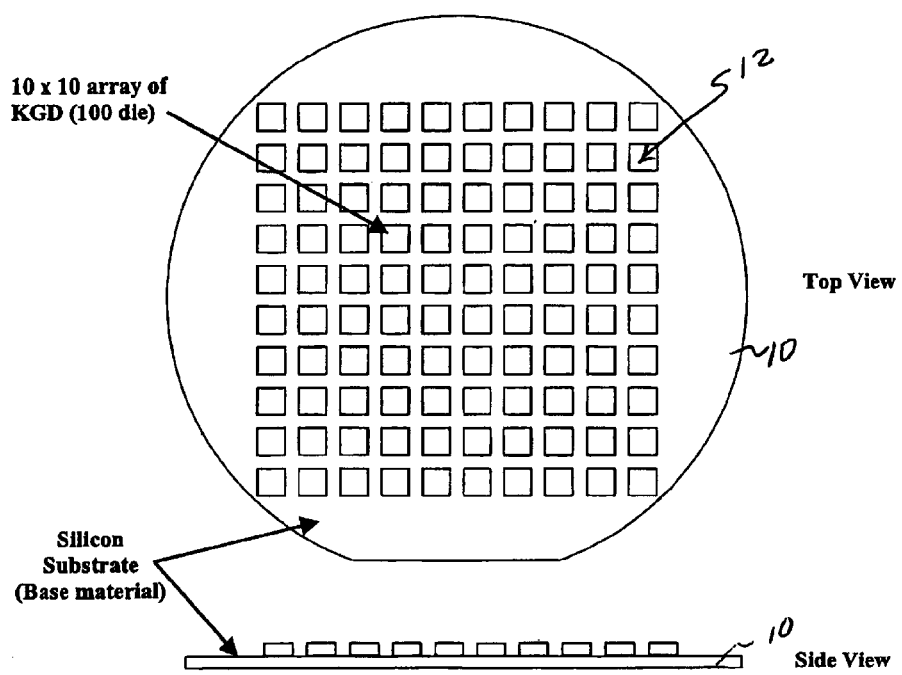
FIG. 1 shows a known good die array of 100 die on a substrate according to the preferred teachings of the present invention.

All figures are drawn for ease of explanation of the basic teachings of the present invention only; the extensions of the figures with respect to number, position, relationship, and dimensions of the parts to form the preferred embodiment will be explained or will be within the skill of the art after the following description has been read and understood.

Further, the exact dimensions and dimensional proportions to conform to specific current, voltage, capacitance, force, weight, strength, and similar requirements will likewise be within the skill of the art after the following description has been read and understood. Where used in the various figures of the drawings, the same numerals designate the same or similar parts. Furthermore, when the terms "end," "bottom," "first," "second," "left," "right," "top," and similar terms are used herein, it should be understood that these terms have reference only to the structure shown in the drawings as it would appear to a person viewing the drawings and are utilized only to facilitate describing the illustrative embodiments.

DESCRIPTION OF THE PREFERRED EMBODIMENTS

Provisions are suitably provided to provide a method to thin a known good die 12 also known as the known good die 12 thinning process. According to the preferred teachings of the present invention the known good die 12 thinning process reduces known good die 12 from a full thickness of 26 mils down to 5 mils, or other reduced dimension, by using a dielectric deposition, pick and place, and grinding processes. The process was developed to reduce the thickness on individual known good die 12, and not an entire six, eight or twelve inch wafer.

A known good die is classified as a fully functional integrated circuit (IC) used in the microelectronics industry. A die is also known as an integrated circuit (IC), or chip. A thinning Process is a process that reduces the die thickness from full to a reduced thickness. In one example embodiment, die thickness is reduced from 26 to 5 mils. A die pick and place process is a process that utilizes a pick and place tool to place die 12 at predetermined x & y locations on a silicon substrate 10. BCB (Bisbenzocyclobutene) is an electronic polymer/resin used to manufacture dielectric layers in the microelectronics industry. A silicon wafer is a base substrate 10 material (also known as a silicon substrate 10) used to manufacture integrated circuits on. A photolithography coating tool is a coating tool that uniformly deposits dielectric materials in the microelectronics industry. A full wafer format is commonly designated as six, eight or twelve inch diameter silicon wafers. A mask is a material used as a protective cover for subsequent processing. A hybrid UV cure station is a tool used to irradiate ultra violet rays in order to control the adhesive strength of back grinding tape.

Refer now to FIGS. 2A–2F, provisions are suitably provided to place the die 12 on a base wafer. According to the preferred teachings of the present invention, a pick and place tool is used to place die 12 at predetermined x and y locations on a silicon substrate 10 also known as base wafer 10. Provisions are then suitably provided to cure a substrate bonding material. According to the preferred teachings of the present invention, once the die 12 are placed on the base wafer 10, the substrate 10 bonding material (BCB) is cured in an oven for six minutes at 250° C. This curing process is a polymer conversion that secures the individual ICs to the base wafer. Those skilled in the art will recognize that other compatible placement and curing processes are within the spirit and scope of the invention.

Provisions are suitably provided to cover the substrate 10 and the die 12 with a mask material. According to the preferred teachings of the present invention, the substrate 10 and die 12 are then covered with a mask material known as photoresist 14. The photoresist 14 is deposited on the die 12 and silicon substrate 10 with the photoresist 14 deposition tool. Provisions are suitably provided to spread the photoresist 14 on the substrate 10 and the die 12 and soft bake it. According to the preferred teachings of the present invention, the photoresist 14 deposition process is spin cast to a thickness of 15 microns and soft baked on a hot plate at 100° C. for 1 minute. The photoresist mask 14 prevents silicon debris from re depositing back on the top surface during the grinding process and is later removed. Those skilled in the art will recognize that other masks such as a photoresist mask 14, can be used to protect the top surface of the die. In alternate embodiments, materials such as metal, oxide, or standard photoresist 14 coating materials could be used without deviating from the spirit and scope of the invention.

Provisions are suitably provided to machine the substrate 10 to a desired thickness. According to the preferred teachings of the present invention and after the photoresist mask 14 is applied, the substrates 10 are subjected to a grinding operation or grinding process. The grinding process is a process that removes the base wafer 10 and, secondly, reduces the original die 12 thickness from twenty-six mils to five mils. A back grinding tape 18 is added to the top surface, thus adding aluminum topside protection. This protection layer eliminates debris from depositing back on the die 12 surface during the grinding operation and, at the same time, secures the die 12 for shipment. Those skilled in the art will recognize that any other compatible machining technique is within the spirit and scope of the invention.

Provisions are suitably provided to remove the photoresist mask 14 and back grinding tape 18. According to the preferred teachings of the present invention, the back grinding tape 18 is removed by placing the known good die 12 and the back grinding tape 18 face up in a UV cure station. The back grinding tape 18 is then UV irradiated for two minutes, therefore, reducing the adhesive strength from 400 g/25 mm to 5 g/25 mm. Although the back grinding tape 18 has been cured, it still maintains a force of 5 g/25 mm. With this small force still applied to the top surface of the die, the back grinding tape 18 and known good die 12 are then placed face down on a manual tape station. The UV transfer tape 22 is then applied to the backside of the die 12 along with a dicing film frame 20. The dicing film frame 20 and tape 22 are normally used during a dicing operation to secure die 12 in a full wafer format, but in this case it is used as a mechanical stabilizer to secure the thinned die 12. Once the film frame 20, transfer tape 22 and thinned ICs 12 are secure, the back grinding tape 18 is removed with a tweezers. According to the preferred teachings of the present invention, after the tape transfer process is complete, the photoresist mask 14 must also be removed from the die surface. The photoresist mask 14 is exposed, developed and rinsed, to remove the mask 14, debris, and tape residue from the IC surface. With the ICs 12 still secure to the transfer tape 22 and film frame 20, they are then placed face down in a UV cure station. The transfer tape 22 is also UV irradiated for 2 minutes, thus, reducing the adhesive strength from 400 g/25 mm to 5 g/25 nun. The film frame 20, transfer tape, and ICs 12 are then placed on a die ejection system followed by a manual pick and place into waffle pack shipping containers.

Provisions are suitably provided to back grind a Square MCM DRAM Tile. During the back grinding process, the MCM was ground to a total thickness of 6 mil. The grinding process grinds only the square MCM tile itself. The grinding can occur in process or be performed at a grinding facility such as the Disco Hi Tec America facility of 3270 Scott Boulevard Santa Clara, Calif. 95054 3011.

Suitable provisions are provided to perform a tape transfer process. According to the preferred teachings of the present invention, the 5.5 mil thick MCM DRAMs are removed from the grinding tape 18 and the process prevents silicon slurry from depositing back on the aluminum pads during the grinding process. Due to the mechanical integrity of thin silicon die 12 (MCM DRAMs), the tape release process, according to the preferred teachings of the present invention, was developed. The process will allow a 5.5 mil thick MCM to be removed from the grinding tape 18 without electrical or mechanical damage. According to the preferred teachings of the present invention, the process allows the die to be processed in full MCM format (120 die/tile).

According to the preferred teachings of the present invention, the MCMs are extremely fragile and required a special UV tape transfer process. The process allows the photoresist mask 14 to be stripped in a full tile format (60 MCMs/tile or 120 die/tile) and allow the parts to be pick and placed in waffle pack carriers.

According to one aspect of the present invention according to the preferred teachings of the present invention, the process utilizes Lintec's UV tape and is performed by following these procedures:
1. Dice out and Tile MCM Array
   Micro Automation Saw
   Label MCM's
   Dehydrate MCM tile @ Vacuum Dehyd. (YES 3 vacuum oven, 135° C., Prg. #0, 10 Torr, 11 min)
2. Package in ESD bags
   *Heat seal two MCMs per ESD bag
   Final grind thickness, supply Lintec's UV tape with package
   Apply Lintec's tape to the front side on the BTB MCM
   Grind to 5.5 mils final thickness
   UV Cure Back Grinding tape
   Place MCMs face up in the 6" Hybrid UV cure station. (UV cure time 2 min.)
   Apply Lintec's UV transfer tape 22 (part/# D 675) to the back side of the MCM This process is preformed on the Micro Automation Tape Mounting Station (model/# 160)
remove E-6142 A manually with tweezers from the top (use ESD precautions).
Exposure/Develop
Place the film frame 20, D 675 tape, and MCM on the Karl Suss photo tool, then expose and develop the resist.
This process removes the photoresist mask 14 thus, exposing the aluminum pads. 100% Inspection: No silicon slurry should be present on the MCMS.
UV Cure the transfer tape
Place the film frame and MCM upside down on the Hybrid UV cure station for 2 min.
Place film frame 20 on the heat/vacuum pin release mechanism
This process removes the MCMs from the transfer tape.
Place the individual MCMs in waffle packs
Measure the final thickness w/drop gauge.
Log the data on the travelers
Scope
   The purpose of this specification is to provide information and procedures for back grinding the DD DRAM MCMs for the BTB project.
Terms & Definitions
   UV Cure Exposure to ultraviolet radiation of light for a period of time.
   UV Back grinding tape 18 Ultraviolet releasable back grinding and/or dicing tape.
   Tape transfer process A UV tape transfer process utilized and developed by USTC according to the preferred teachings of the present invention.
Equipment & Materials
   Lintec Corp., UV back grinding tape, part No. E-6142A
   Lintec Corp., UV transfer tape, part No. D-675
   6" Stand film frame 20 re machined to 7.819", Perfection Products, Inc., part/# FF 080
   Micro Automation Mounting Station Model 160
   Die de mounting tool, Semiconductor Equipment Corp. model 4800
   Hybrid Technology, Deep UV Cure Station, Model 5LPR
   Simco Aerostat Ionized Air Blower, model XT, Ransburg Company
   Drop Gauge Sylvac model 50
   Pen Vac A Vacuum device use to manually pick and place individual ICs.
Safety
   General
   Reference Safety Specifications (Spec P 0400) located in Qual Trax.
Handling
1. The use of ESD procedures will be observed whenever handling, transporting, or storing static sensitive devices or assemblies. Reference ESD Handbook 755.
Procedure
   Perform the Photoresist mask 14 deposition process to the BTB MCM
   Reference: Qualtrax specification No. P 1224
   Perform the dicing operation
   Reference: Qualtrax specification No. P 1309
   Apply the supplied UV tape to the front side of the MCM. Grind the MCM's. After all the MCMs have been ground to the final thickness (5.5 mils), they are placed in special shipping containers (6" Pink boats manufactured by Malaster Company).

Place the MCM face up on the Hybrid UV cure station.

Cure the back grinding tape 18 (E-6142A) on the Hybrid UV cure station for 2 minutes.

Place MCM face down on the Micro Automation mounting tape station (model No. 160)

Caution: Do not apply vacuum to secure the MCM. The vacuum pressure can crack the fragil die.

Apply Lintec's UV transfer tape 22 (part No. D-675) to the backside of the MCM.

Remove the back grinding tape 18 (E-6142A) from the topside with a tweezers.

The back grinding tape 18 should peel away from the top surface of the die very easy (use ESD precautions)

Expose and develop the photoresist mask 14.

Process Note: The photoresist 14 expose and develop processes are found on Qualtrax (Specification No. P 1224).

The photoresist mask 14 is then blanket exposed and developed utilizing the Karl Suss photolithography tool. The photoresist 14 exposure and development are performed with the dicing film frame 20, UV transfer tape, and MCM.

After the Photoresist mask 14 is removed, inspect the die surface for debris.

A 5× objective lens is used to inspect the top die surface for the following: Residual silicon slurry (from the grinding process) Residual photoresist 14 Back grinding tape UV cure the backside transfer tape 22 for 2 min.

Place the dicing film frame, UV transfer tape, and MCM upside down on the Hybrid UV cure tool.

Place the film frame 20, UV transfer tape, and MCM on the die release tool (Semiconductor Equipment Corp. model 4800).

Place the individual MCMs in waffle packs with the pen vac.

Maintenance

Not applicable.

Quality

Measure final MCM Thickness

Measure the final MCM thickness with the Sylvac 50 drop gauge.

Log Data

Log the thickness data in the traveler and store in ESD approved dry box.

Those skilled in the art will recognize that other methods of performing the forgoing tasks can be used without deviating from the spirit and scope of the invention and that these manufacturing procedures are included by way of example and not limitation.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. Method comprising:
providing a substrate;
depositing substrate bonding material on the substrate;
placing a plurality of die on the substrate;
curing the substrate bonding material to secure the plurality of die to the substrate;
covering the substrate and the plurality of die with a mask material;
applying a back grinding tape to a surface of the mask material;
grinding the substrate and the plurality of die to thin the plurality of die;
applying a UV transfer tape to the die on a film frame;
removing the mask material and back grinding tape residue;
placing the plurality of die, UV transfer tape, and film frame face down in a UV cure station;
UV irradiating the UV transfer tape; and
removing the plurality of die from the UV transfer tape.

2. The method of claim 1 with depositing substrate bonding material on the substrate further comprising depositing BCB.

3. The method of claim 1 with curing the substrate bonding material to secure the plurality of die to the substrate comprising curing in an oven for six minutes at a temperature of at least 250° degrees Centigrade.

4. The method of claim 1 with covering the substrate and the die with the mask material further comprising covering the substrate and the die with a photoresist.

5. The method of claim 1 with covering the substrate and the die with a mask material further comprising spin casting the mask material to a thickness of 15 microns; and
soft baking on a hot plate at at least 100° C. for at least 1 minute.

6. The method of claim 1 with covering the substrate and the die with the mask material further comprising covering the substrate and the die with metal.

7. The method of claim 1 with covering the substrate and the die with the mask material further comprising covering the substrate and the die with oxide.

8. The method of claim 1 with covering the substrate and the die using standard photoresist coating methods.

9. The method of claim 1 with grinding the substrate and the plurality of die further comprising grinding the substrate and the plurality of die to remove the substrate and to reduce an original die thickness from 26 mils to 5 mils.

10. The method of claim 1 with removing the mask material and the back grinding tape further comprising placing the die and the back grinding tape so that they are positioned face up in an ultraviolet cure station.

11. The method of claim 1 further compromising the back grinding tape UV irradiated and cured for at least two minutes to reduce an adhesive strength to less than or equal to 5 g/25 mm.

12. The method of claim 11 further comprising, after the back grinding tape has been cured and while the tape maintains a force of 5 g/25 mm applied to a top surface of the die, placing the back grinding tape and die face down on a manual tape station and applying a transfer tape to a backside of the die along with a dicing film frame as a mechanical stabilizer to secure the plurality of die that have been thinned.

13. The method of claim 1 with removing the back grinding tape with tweezers once the film frame, transfer tape 22 and thinned ICs are secure.

14. The method of claim 1 further comprising removing the mask material by exposing, developing, rinsing and removing the mask material, debris, and tape residue from the plurality of die.

15. The method of claim 1 with placing the plurality of die, UV transfer tape and film frame further comprising placing those die still secure to the UV transfer tape and film frame face down in a UV cure station.

16. The method of claim 1 with UV irradiating the UV transfer tape further comprising UV irradiating the UV transfer tape for 2 minutes to reduce an adhesive strength from 400 g/25 mm to 5 g/25 mm.

17. The method of claim 1 with removing the plurality of die from the UV transfer tape further comprising placing the film frame, transfer tape, and plurality of die on a die ejection system followed by a pick and place operation into waffle pack shipping containers.

18. The method of claim 1 with providing a substrate further comprising providing a wafer.

19. The method of claim 1 with providing a substrate further comprising providing a silicon wafer.

* * * * *

UNITED STATES PATENT AND TRADEMARK OFFICE
CERTIFICATE OF CORRECTION

PATENT NO. : 6,861,336 B1
DATED : March 1, 2005
INVENTOR(S) : Kevin Wade Hampton It is certified that error appears in the above-identified patent and that said Letters Patent is hereby corrected as shown below:

Column 8,
Line 52, delete "compromising" and insert -- comprising --.

Signed and Sealed this

Thirty-first Day of May, 2005

JON W. DUDAS
*Director of the United States Patent and Trademark Office*